(12) United States Patent
Roufoogaran

(10) Patent No.: US 7,944,322 B2
(45) Date of Patent: May 17, 2011

(54) METHOD AND SYSTEM FOR FLIP CHIP CONFIGURABLE RF FRONT END WITH AN OFF-CHIP BALUN

(75) Inventor: Razieh Roufoogaran, Venice, CA (US)

(73) Assignee: Broadcom Corporation, Irvine, CA (US)

( * ) Notice: Subject to any disclaimer, the term of this patent is extended or adjusted under 35 U.S.C. 154(b) by 56 days.

(21) Appl. No.: 12/112,258

(22) Filed: Apr. 30, 2008

(65) Prior Publication Data

US 2009/0273411 A1 Nov. 5, 2009

(51) Int. Cl.
*H03H 7/42* (2006.01)
*H01P 1/10* (2006.01)
*H04B 1/40* (2006.01)

(52) U.S. Cl. .................................. 333/25; 333/101
(58) Field of Classification Search .................. 333/25, 333/26, 101, 246
See application file for complete search history.

(56) References Cited

U.S. PATENT DOCUMENTS

| | | | |
|---|---|---|---|
| 6,982,609 B1 * | 1/2006 | McKay et al. | 333/25 |
| 7,307,331 B2 * | 12/2007 | Kipnis et al. | 257/499 |
| 7,348,842 B2 * | 3/2008 | Ichitsubo et al. | 330/66 |
| 7,439,842 B2 * | 10/2008 | Fujiki et al. | 336/200 |

* cited by examiner

*Primary Examiner* — Dean O Takaoka
(74) *Attorney, Agent, or Firm* — McAndrews, Held & Malloy, Ltd.

(57) ABSTRACT

Methods and systems for a flip chip configurable RF front end with an off-chip balun may include bonding a balun package to a single integrated circuit (IC) comprising an integrated transmitter and a receiver. The balun package may comprise one or more layers and may be electrically coupled to the IC. The balun package may comprise various devices such as, for example, inductors, capacitors, resistors, and/or switches, which may be on an exterior surface and/or inner layers of the balun package. Accordingly, the balun package and/or the IC may be configured for receiving RF signals and/or transmitting RF signals. The balun package and/or the IC may also be configured for single-ended RF input, single-ended RF output, differential RF input, and/or differential RF output. An off-chip amplifier may be used to amplify signals on the single transmit line in the single-ended RF output mode of operation.

24 Claims, 9 Drawing Sheets

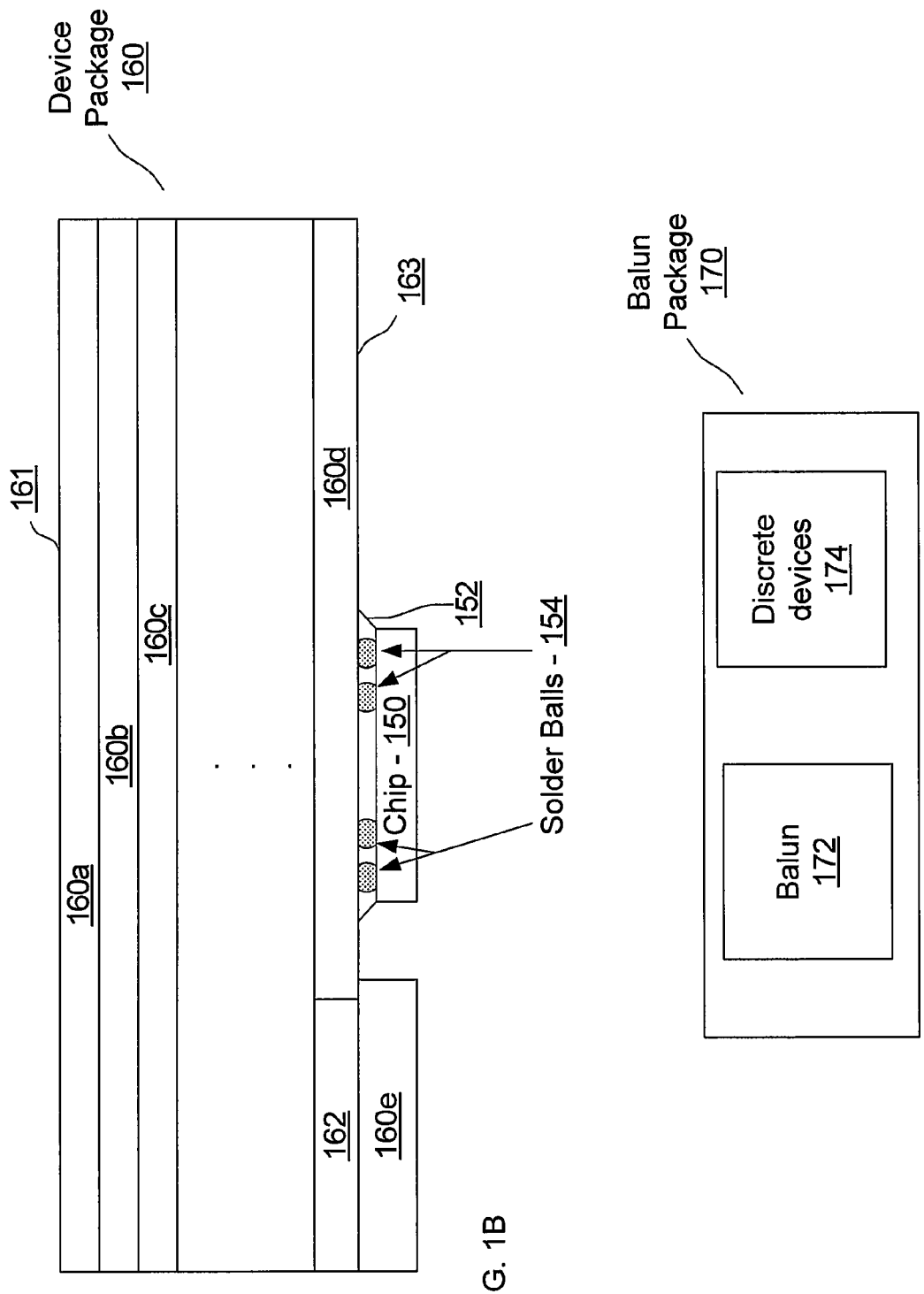

METHOD AND SYSTEM FOR FLIP CHIP CONFIGURABLE RF FRONT END WITH AN OFF-CHIP BALUN

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a flip chip configurable RF front end with an off-chip balun.

BACKGROUND OF THE INVENTION

In some conventional systems, a wireless system may broadcast radio frequency (RF) signals and receive RF signals. Generally, RF signals are transmitted at power levels that may be specified by various communication standards. For example, a third generation (3G) cellular system may use some form of code-division multiple access (CDMA) standard that controls transmission power level of each mobile terminal. Other wireless standards, such as the Bluetooth standard, may allow transmission at different power levels depending on a specification for the range of the Bluetooth device.

The RF signals to be transmitted may be amplified to a desired power level by a power amplifier before being communicated to a transmit antenna. Accordingly, a RF power amplifier may need to be able to output various ranges of power levels. Additionally, a wireless system may also receive RF signals, which may be much weaker than transmitted RF signals. The received RF signals may be amplified to levels suitable for processing by a low noise amplifier (LNA).

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a flip chip configurable RF front end with an off-chip balun, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 1B is a block diagram of a device package and a flip-chip, in accordance with an embodiment of the invention.

FIG. 1C is a block diagram of a device package mounted above a flip-chip, in accordance with an embodiment of the invention.

DETAILED DESCRIPTION OF THE INVENTION

Certain embodiments of the invention may be found in a method and system for a flip chip configurable RF front end with an off-chip balun. Aspects of the method may comprise bonding a balun package to a single transmitter and/or receiver integrated circuit (IC). The balun package may comprise one or more layers and may be electrically coupled to the single IC. The balun package may comprise various devices such as, for example, inductors, capacitors, resistors, and/or switches, which may be on an exterior surface and/or on one or more inner layers of the balun package. Accordingly, the balun package and/or the single IC may be configured for receiving RF signals and/or transmitting RF signals.

The balun package and/or the single IC may also be configured for single-ended RF input, single-ended RF output, differential RF input, and/or differential RF output. In a single-ended RF output configuration, an off-chip amplifier may be coupled to the single-ended output line to amplify signals on the single-ended output line.

Figure 1A:
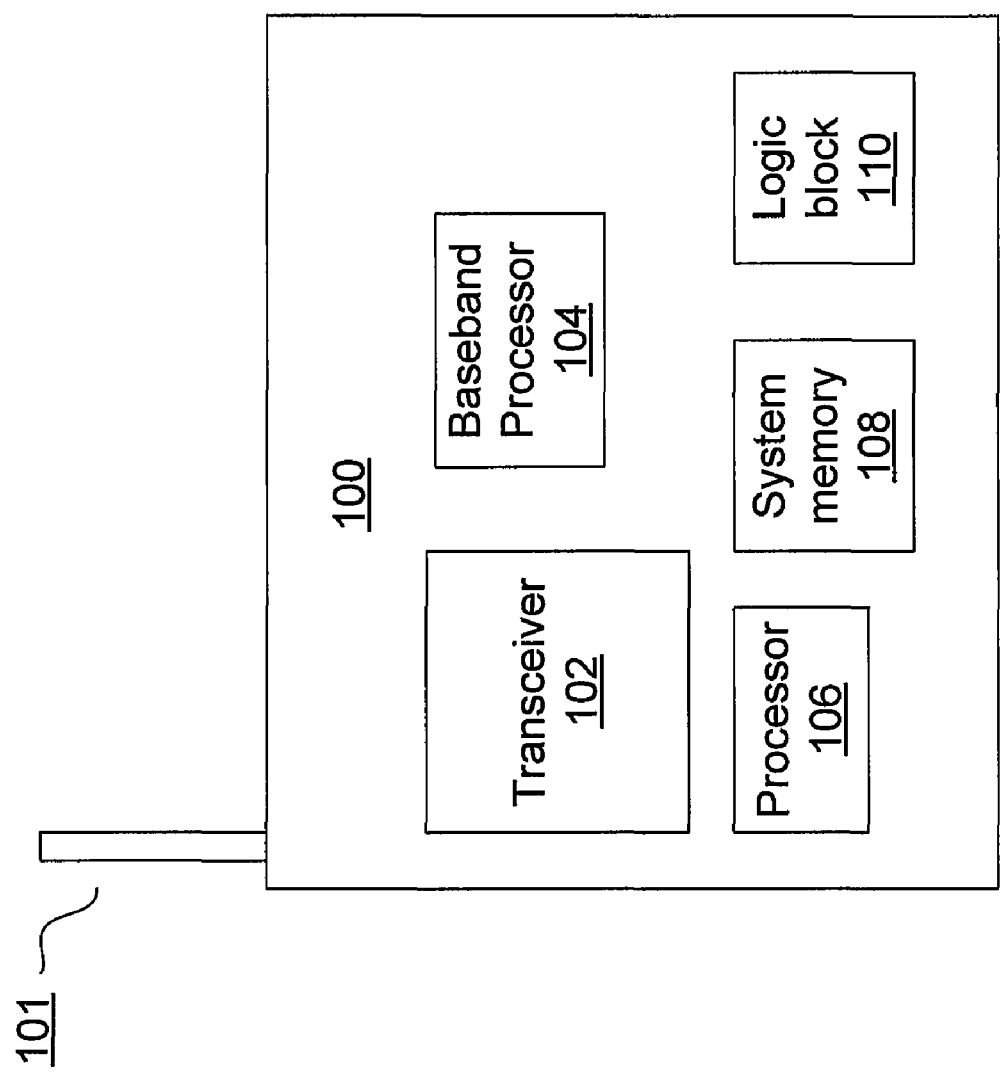
FIG. 1A is a block diagram of an exemplary wireless system, which may be utilized in connection with an embodiment of the invention.

FIG. 1A is a block diagram of an exemplary wireless system, which may be utilized in connection with an embodiment of the invention. Referring to FIG. 1A, the wireless system 100 may comprise an antenna 101, a transceiver 102, a baseband processor 104, a processor 106, a system memory 108, and a logic block 110. The antenna 101 may be used for reception and/or transmission of RF signals. The transceiver 102 may comprise suitable logic, circuitry, and/or code that may be adapted to modulate and upconvert baseband signals to RF signals for transmission by one or more antennas, which may be represented generically by the antenna 101.

The transceiver 102 may also be adapted to downconvert and demodulate received RF signals to baseband signals. The RF signals may be received by one or more antennas, which may be represented generically by the antenna 101. Different wireless systems may use different antennas for transmission and reception. The transceiver 102 may be adapted to execute other functions, for example, filtering the baseband and/or RF signals, and/or amplifying the baseband and/or RF signals.

The baseband processor 104 may comprise suitable logic, circuitry, and/or code that may be adapted to process baseband signals for transmission via the transceiver 102 and/or the baseband signals received from the transceiver 102. The processor 106 may be any suitable processor or controller such as a central processing unit (CPU) or digital signal processor (DSP), or any type of integrated circuit processor. The processor 106 may comprise suitable logic, circuitry, and/or code that may be adapted to control the operations of the transceiver 102 and/or the baseband processor 104. For example, the processor 106 may be utilized to update and/or modify programmable parameters and/or values in a plurality of components, devices, and/or processing elements in the transceiver 102 and/or the baseband processor 104.

Control and/or data information, which may comprise the programmable parameters, may be transferred from other portions of the wireless system 100, which may not be shown, to the processor 106. Similarly, the processor 106 may be adapted to transfer control and/or data information, which may include the programmable parameters, to other portions of the wireless system 100, which may not be shown, which may be part of the wireless system 100.

The processor 106 may utilize the received control and/or data information, which may comprise the programmable parameters, to determine an operating mode of the transceiver 102. For example, the processor 106 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 108 via the processor 106, for example. The information stored in system memory 108 may be transferred to the transceiver 102 from the system memory 108 via the processor 106. The system memory 108 may comprise suitable logic, circuitry, and/or code that may be adapted to store a plurality of control and/or data information, including parameters needed to calculate frequencies and/or gain, and/or the frequency value and/or gain value.

The logic block 110 may comprise suitable logic, circuitry, and/or code that may enable controlling of various functionalities of the wireless system 100. For example, the logic block 110 may comprise one or more state machines that may generate signals to control the transceiver 102 and/or the baseband processor 104. The logic block 110 may also comprise registers that may hold data for controlling, for example, the transceiver 102 and/or the baseband processor 104. The logic block 110 may also generate and/or store status information that may be read by, for example, the processor 106. Amplifier gains and/or filtering characteristics, for example, may be controlled by the logic block 110.

FIG. 1B is a block diagram of a device package and a flip-chip, in accordance with an embodiment of the invention. Referring to FIG. 1B, there is shown an integrated circuit 150, which may comprise, for example, the transceiver 102, which may be bonded, or mounted, as a flip-chip. There is also shown a device package 160 that may comprise, for example, one or more layers 160a . . . 160e. Discrete devices (not shown) may be placed on the device package 160, for example, on a surface 161, 163 of the device package 160. The discrete devices may also be embedded in one or more layers of the device package 160. Additionally, various types of devices may be fabricated on the device package 160. For example, trace lines may be used to form inductors and/or resistors. Additionally, a portion of two different layers 160a and 160c of the device package 160 may be used as conductive electrodes, and a portion of a layer 160b may be used as a dielectric. A switch may be fabricated using, for example, MEMS technology.

Conductive paths may be laid on the surface 161, 163 of the device package 160, and also on the plurality of layers 160a . . . 160e to communicate electrical signals among the various discrete devices associated with the device package 160. The layer 160e may be directly mounted with a same substrate, or a printed circuit board, on which the integrated circuit 150 may be mounted to. Conductive paths may also communicate electrical signals from one layer to another in the device package 160, and from the device package 160 to the integrated circuit 150. Distances between conductive paths may be larger than distances between traces on an integrated circuit, such as, for example, the integrated circuit 150. Accordingly, there may be smaller parasitic effects between signals on the conductive paths of the device package 160 than with respect to the same signals on the traces of the integrated circuit 150. Additionally, since the conductive paths of the device package 160 may be wider than the traces on the integrated circuit 150, there may be less loss for signals in the device package 160 than in the integrated circuit 150.

The integrated circuit 150 may be bonded to the device package 160 utilizing, for example, the solder balls 154. In this manner, wire bonds connecting the chip 150 to the device package 160 may be eliminated, reducing and/or eliminating uncontrollable stray inductances due to wire bonds. In addition, the thermal conductance out of the chip 150 may be greatly improved utilizing the solder balls 154 and the thermal epoxy 152. The thermal epoxy 152 may be electrically insulating but thermally conductive to allow for thermal energy to be conducted out of the chip 150 to the much larger thermal mass of the device package 160. Materials with magnetic properties may also be deposited on to portions of the layers 160a . . . 160e to enhance quality of the discrete devices and/or reduce size of a discrete device. For example, a portion 162 of the layer 160d may be deposited with magnetic material.

In operation, the integrated circuit 150 may comprise a RF front end, such as, for example, the RF transceiver 102, described with respect to FIG. 1, and may be utilized to transmit and receive RF signals. The integrated circuit 150 may be electrically coupled to the device package 160, where the device package 160 may comprise suitable circuitry that may enable processing signals communicated to or from the integrated circuit 150. Although an embodiment of the invention may be described as comprising the RF transceiver 102, the invention need not be so limited. For example, various embodiments of the invention may comprise separate receivers and transmitters.

FIG. 1C is a block diagram of a device package mounted above a flip-chip, in accordance with an embodiment of the invention. Referring to FIG. 1C, there is shown the balun package 170 that may be similar to the device package 160. The balun package 170 may comprise a balun 172 and one or more discrete devices 174.

The balun 172 may comprise suitable circuitry such as a transformer that may enable coupling RF signals between, for example, an antenna, for example, the antenna 101, and the integrated circuit 150. The balun 172 may be a discrete device that may be placed on or in the balun package 170, or the balun may be fabricated as part of the balun package 170 by appropriately fabricating a plurality of inductors.

The discrete devices 174 may comprise, for example, capacitors, resistors, inductors, and/or switches that may be used to process the RF signals handled by the balun 172. Accordingly, the discrete devices 174 may be separate components that may be placed on, or in, the balun package 170. The discrete devices 174 may also be fabricated as a part of the balun package 170. Resistors and inductors may be fabricated from, for example, trace paths in the balun package 170. A capacitor that may be fabricated using, for example, three layers of the balun package 170. For example, portions of the layers 160a and 160c may comprise conductive electrodes, and a portion of the layer 160b may form the dielectric portion of a capacitor.

The balun 172, and/or other discrete devices 174, may utilize deposition of ferromagnetic material in the balun package 172. This may result in, for example, increased quality of the balun 172 and/or other discrete devices 174, and/or reducing size of the balun 172 and/or discrete devices 174.

In operation, the balun 172 may be operable to generate balanced or unbalanced signals to enable communication of RF signals from the antenna 101 to the integrated circuit 150, and from the integrated circuit 150 to the antenna 101. The various discrete devices 174 may be used for AC coupling the RF signals, filtering the RF signals, and/or configuring the wireless system 100 for various types of transmission modes and/or reception modes.

Figure 2:
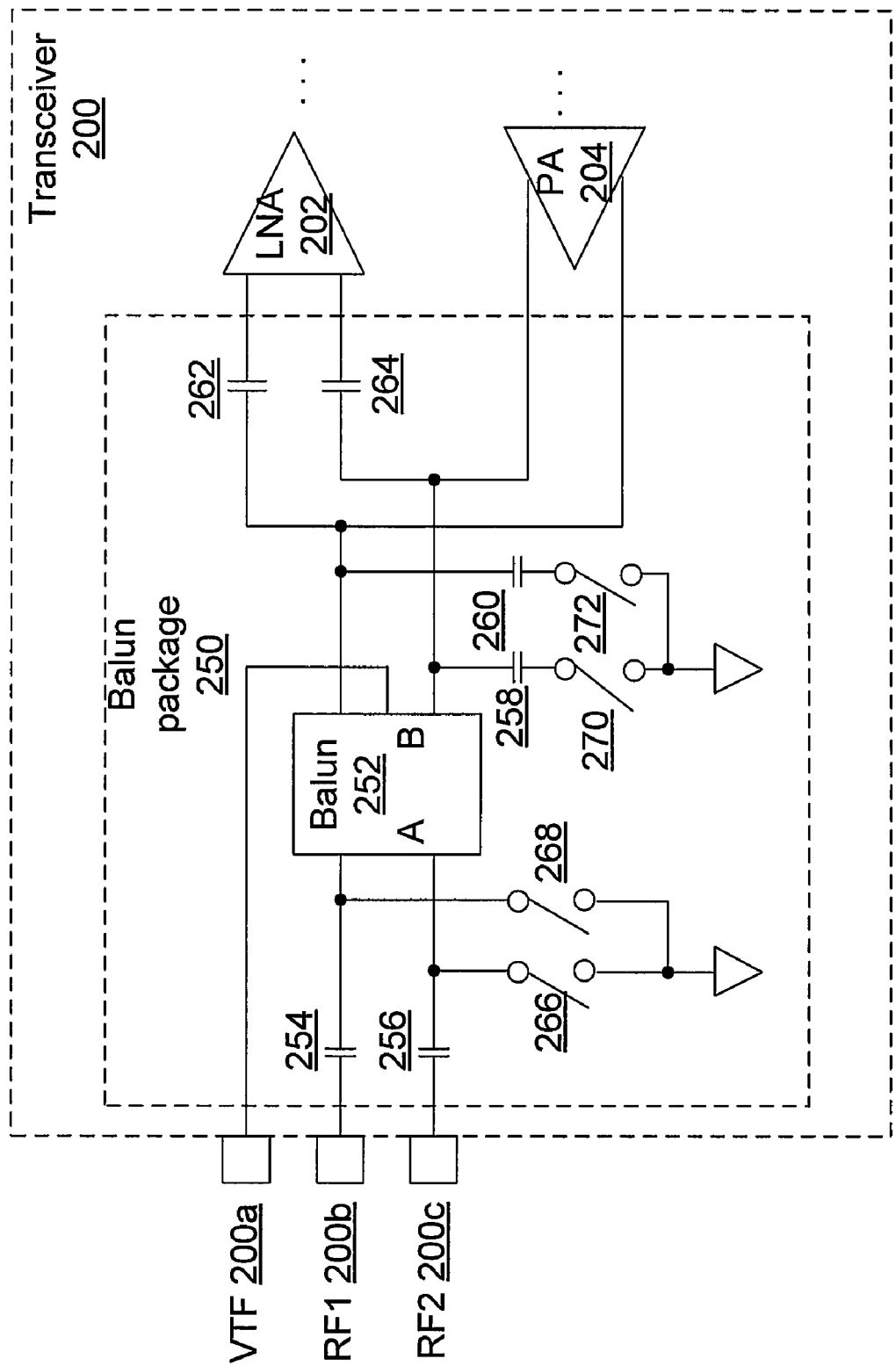
FIG. 2 is a block diagram illustrating an exemplary transceiver on a chip, in accordance with an embodiment of the invention.

FIG. 2 is a block diagram illustrating an exemplary transceiver on a chip, in accordance with an embodiment of the invention. Referring to FIG. 2, there is shown a transceiver 200, which may be similar in functionality to the transceiver 102. The transceiver 200 may be, for example, on a single chip, such as, for example, the integrated circuit 150. The transceiver 200 may comprise, in part, a low-noise amplifier (LNA) 202 and a power amplifier 204. There is also shown a balun package 250 that may be similar to the balun package 170. The balun package 250 may comprise a balun 252, capacitors 254, 256, 258, 260, 262, and 264, and switches 266, 268, 270, and 272. Accordingly, the balun package 250 may be placed above the transceiver 200, as described with respect to FIG. 1B. There are also shown I/O pads 200a, 200b, and 200c for input and output of signals. The I/O pads may be part of the transceiver 200, or the I/O pads may be part of the balun package 250.

The LNA 202 may comprise suitable logic and/or circuitry that may enable variable gain amplification of RF signals received by, for example, the wireless system 100. The LNA 202 may comprise a single-ended input or differential inputs, and may generate a single-ended output or differential output. The number of inputs and the number of outputs for the LNA 202 may be design and/or implementation dependent. The LNA 202 may be controlled by, for example, the baseband processor 104, the processor 106, and/or the logic block 110.

The power amplifier 204 may comprise suitable logic and/or circuitry that may allow amplification of RF signals for transmission by the wireless system 100. The power amplifier 204 may be, for example, a variable gain amplifier where the output power may be grouped into a plurality of power ranges. For example, one power range may have an upper limit of 5 dBm, and another power range may have an upper limit of 12 dBm. The power amplifier 204 may comprise a single-ended input or differential inputs, and may generate a single-ended output or differential output. The number of inputs and the number of outputs for the power amplifier 204 may be design and/or implementation dependent. The balun 252 may comprise suitable circuitry that may enable coupling RF signals from side A to side B of the balun 252, and vice versa.

The capacitors 254 and 256, and 262 and 264 may provide AC coupling for signals to and from side A of the balun 252, and to the LNA 202, respectively. The switches 266 and 268 may be controlled by a processor in the wireless system 100, such as, for example, the processor 106, to allow different transmission and/or reception configurations. The switches 266 and 268 may also be controlled, for example, by the baseband processor 104 and/or the logic block 110. Various exemplary configurations are described in more detail with respect to FIGS. 3A-6.

The capacitors 258 and 260 may be configured by the switches 270 and 272, respectively, as additional capacitive loads to be used as needed. For example, when the LNA 202 is turned off, the switches 270 and 272 may be closed to provide various compensating capacitive loads for the power amplifier 204. The switches 270 and 272 may be controlled similarly to the switches 266 and 268 by, for example, the processor 106, the baseband processor 104, and/or the logic block 110. In one embodiment of the invention, the switches 266 and 268 may be coupled to, for example, receiver circuitry ground plane used by the LNA 202, and the switches 270 and 272 may be coupled to, for example, power amplifier ground plane used by the power amplifier 204. The invention need not be so limited, however. Various embodiments of the invention may use other ground planes.

Various parts of the balun package 250, such as, for example, the capacitors 262, 264, 266, and 268, and the switches 266, 268, 270, and 272 may also be optimized to tolerate the various output power levels generated by the power amplifier 204. Accordingly, the capacitors 254, 256, 258, 260, 262, and 264, and the switches 266, 268, 270, and 272 may be able to tolerate, for example, power levels of up to 12 dBm or more if the power amplifier 204 is able to generate output power levels of 12 dBm or more.

In operation, a center tap for side B of the balun 252 may be connected to an appropriate voltage for the output power desired via, for example, the chip I/O pad 200a. Accordingly, the voltage at the chip I/O pad 200a may be communicated to the balun 252 via the transceiver 200, or directly to the balun package 250 via, for example, the layer 160e. The chip I/O pad 200a may be connected to a voltage $V_{TF}$ that may be, for example, 1.5 volts for some power output levels. For example, power output levels of up to 5 dBm may use the voltage $V_{TF}$ of 1.5. volts. Higher power output levels may use the voltage $V_{TF}$ that may be, for example, 2.5 volts or 3.3 volts. The switches 266 and 268 may be opened or closed depending on whether an off-chip power amplifier (not shown for FIG. 2) is used, whether the transceiver 200 may be operating in a receive mode or a transmit mode, and whether differential mode may be used.

For example, a transmit mode that may utilize an off-chip power amplifier may use one of the chip I/O pads 200b and 200c to input received RF signals to the transceiver 200 and may use the other of the chip I/O pads 200b and 200c to output RF signals to be amplified by an off-chip power amplifier. Accordingly, the input and output RF signals at the chip interface may be single-ended via the chip I/O pads 200b and 200c. For another transmit mode that may not use an off-chip power amplifier, the power amplifier 204 may be used to output power of up to, for example, 5 dBm, or substantially 5 dBm. The transceiver 200 may be configured for use with higher output power, such as, for example, substantially 12 dBm. The output of the transceiver 200 at the chip interface may also be a single-ended output via the chip I/O pads 200b and 200c. The transceiver 200 may also be configured for differential input/output via the chip I/O pads 200b and 200c.

The received RF signals may be communicated from, for example, an antenna such as the antenna 101. While the antenna 101 may have been described as a single antenna, the invention need not be so limited. For example, the antenna 101 may comprise a plurality of antennas, and there may be separate antennas dedicated to transmission and to reception.

The exemplary upper power limits discussed, substantially 5 dBm and 12 dBm, may change with different embodiments of the RF front end in the transceiver 200. For example, other embodiments of the invention may allow upper power limits of substantially 7 dBm and 15 dBm, or other power levels.

Figure 3A:
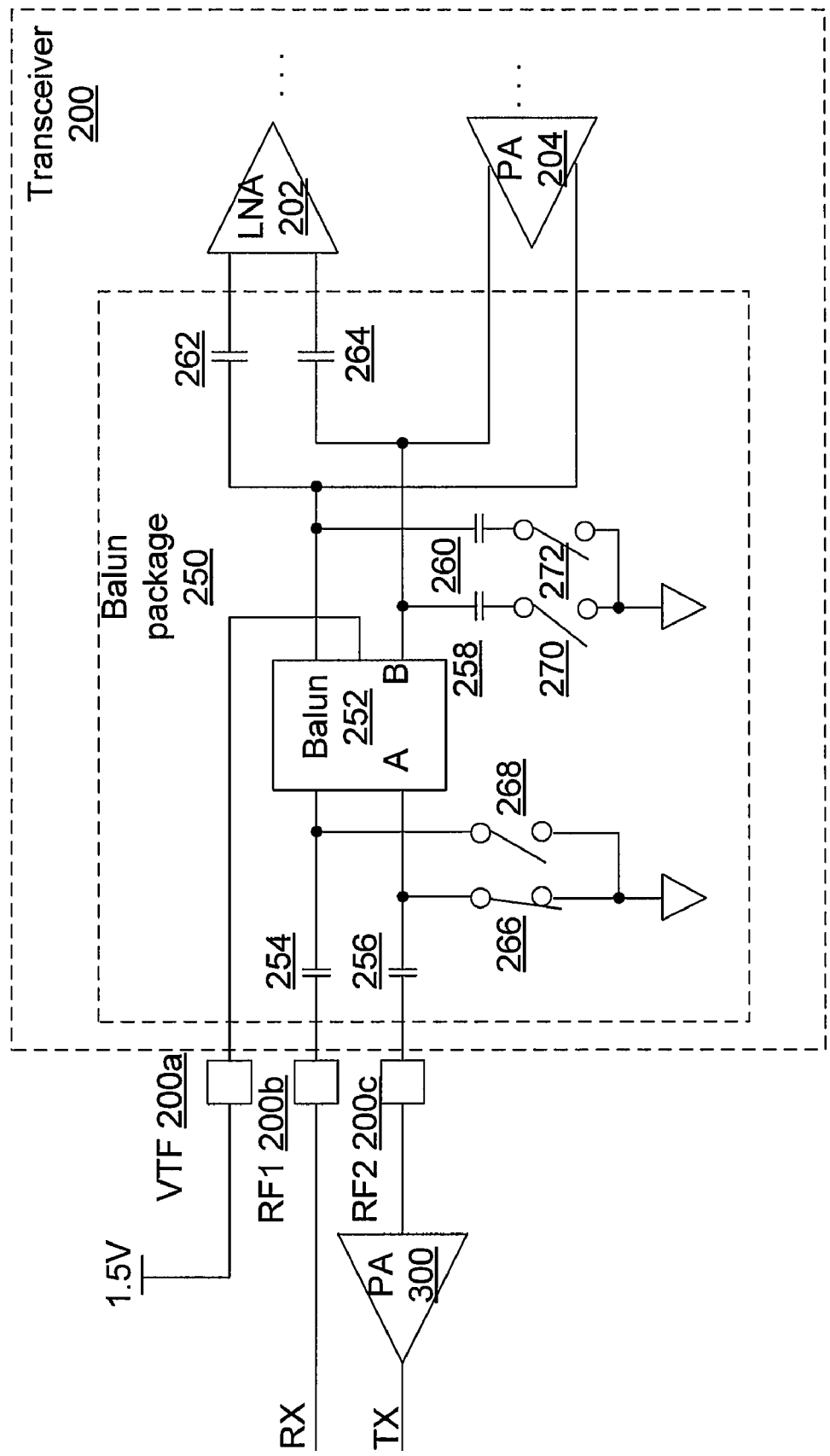
FIG. 3A is a block diagram illustrating an exemplary configuration of a transceiver on a chip, in accordance with an embodiment of the invention.

FIG. 3A is a block diagram illustrating an exemplary configuration of a transceiver on a chip, in accordance with an embodiment of the invention. Referring to FIG. 3A, there is shown the transceiver 200 and the balun package 250 in an exemplary configuration for a receive operation. There are also shown I/O pads 200a, 200b, and 200c for input and output of signals. The I/O pads may be part of the transceiver 200, or the I/O pads may be part of the balun package 250.

The transceiver 200 and the balun package 250 may be configured for use with an off-chip power amplifier 300. Accordingly, the voltage $V_{TF}$ may be, for example, 1.5 volts and the LNA 202 may be turned on. The switch 266 may be closed and the switch 268 may be open. In this manner, the input to the off-chip power amplifier 300 may be grounded, while the received RF signals may be communicated to the transceiver 200. Additionally, during the receive mode, the inputs to the power amplifier 204 may be at a very low power level, if not ground level. Accordingly, the power amplifier 204 may generate very little, if any, RF signals that may interfere with the operation of the LNA 202. Other embodiments of the invention may comprise a power amplifier 204 that may be turned off.

The received RF signals may be communicated to side A of the balun 252 via, for example, the I/O pad 200b. The differential RF output signals from side B of the balun 252 may be communicated to the LNA 202. The LNA 202 may be turned on to amplify the received RF signals. The output of the LNA 202 may be further amplified, filtered, downconverted, and/or demodulated to a baseband signal. The baseband signal may then be communicated to the baseband processor 104 for further processing.

Figure 3B:
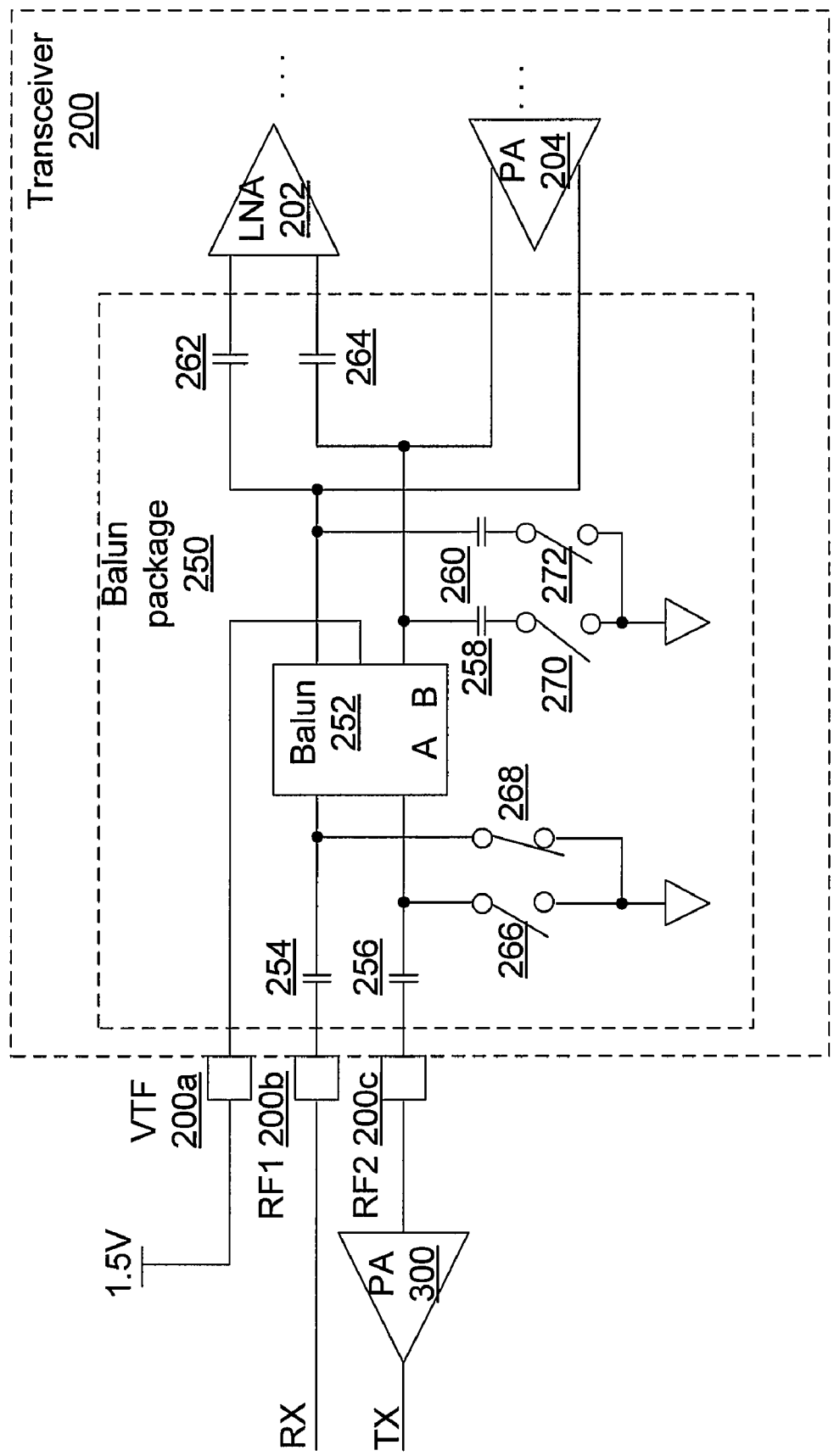
FIG. 3B is a block diagram illustrating an exemplary configuration of a transceiver on a chip, in accordance with an embodiment of the invention.

FIG. 3B is a block diagram illustrating an exemplary configuration of a transceiver on a chip, in accordance with an embodiment of the invention. Referring to FIG. 3A, there is shown the transceiver 200 and the balun package 250 in an exemplary configuration for a transmit operation. There are also shown I/O pads 200a, 200b, and 200c for input and output of signals. The I/O pads may be part of the transceiver 200, or the I/O pads may be part of the balun package 250.

The transceiver 200 and the balun package 250 may be configured for use with the off-chip power amplifier 300. The voltage $V_{TF}$ may be, for example, 1.5 volts for transmit power of up to, for example, substantially 5 dBm. The output power level of the transceiver 200 may depend, for example, on input and amplifying specifications of the off-chip power amplifier 300. The LNA 202 may be turned off since the transceiver 200 may be in a transmit mode. The switch 266 may be open and the switch 268 may be closed. In this manner, the input to the off-chip power amplifier 300 may be from the output of side A of the balun 252. The received RF signals may be, for example, shorted to ground via the closed switch 204.

During the transmit mode, RF signals to be transmitted may be communicated to the inputs of the power amplifier 204. Accordingly, the power amplifier 204 may amplify RF signals, and the amplified RF signals may be communicated to the B side of the balun 252. The RF signals may then be coupled to the A side of the balun 252, and thus communicated to the off-chip power amplifier 300 via the I/O pad 200c. The output of the off-chip power amplifier 300 may be communicated to an antenna, for example, the antenna 101, for transmission.

Figure 4:
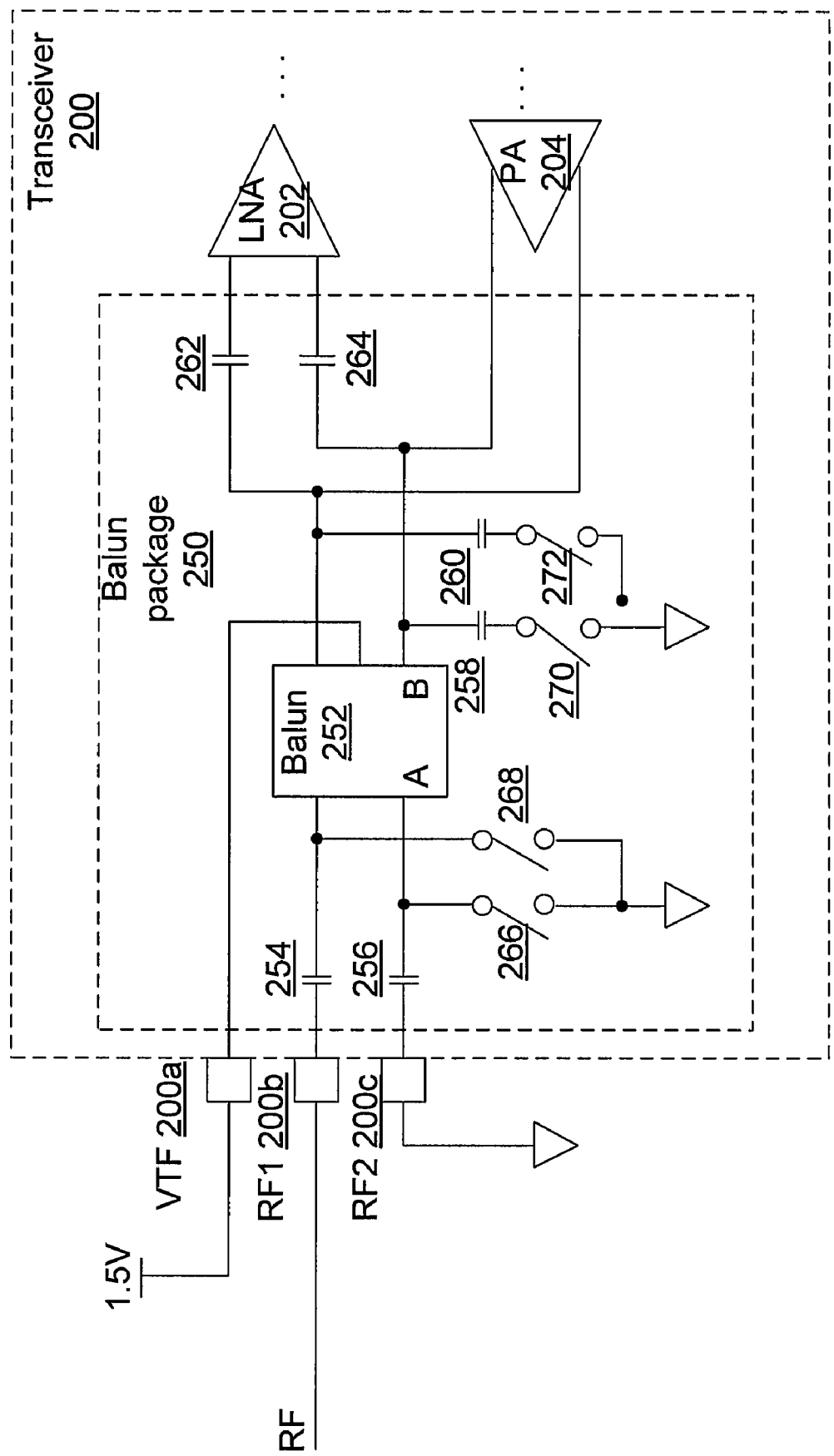
FIG. 4 is a block diagram illustrating an exemplary configuration of a transceiver on a chip, in accordance with an embodiment of the invention.

FIG. 4 is a block diagram illustrating an exemplary configuration of a transceiver on a chip, in accordance with an embodiment of the invention. Referring to FIG. 4, there is shown the transceiver 200 and the balun package 250 in an exemplary configuration for transmit and receive operations. There are also shown I/O pads 200a, 200b, and 200c for input and output of signals. The I/O pads may be part of the transceiver 200, or the I/O pads may be part of the balun package 250.

The transceiver 200 and the balun package 250 may be configured for use without an off-chip power amplifier. In the transmit mode, the output power of the transceiver 200 may be up to, for example, substantially 5 dBm. Accordingly, the voltage $V_{TF}$ may be, for example, 1.5 volts. The LNA 202 may be turned off for single-ended transmit operation. The I/O pad 200b may be used, for example, to communicate RF signals to the antenna 101 for transmission. The I/O pad 200c may be, for example, coupled to ground.

The switches 266 and 268 may be open. In this manner, the RF signals to be transmitted may be communicated to the inputs of the power amplifier 204 where the RF signals may be amplified. The amplified RF signals may then be communicated to the B side of the balun 252. The RF signals may be coupled to the A side of the balun 252, and thus communicated to the I/O pad 200b. The RF signals may then be communicated to the antenna 101 for transmission.

In the receive mode, the RF signals may be received by the antennal 101 and the received RF signals may be communicated to the A side of the balun 252 via the I/O pad 200b. The RF signals may be coupled to the LNA 202 via the B side of the balun 252. The inputs to the power amplifier 204 may be at a very low power level, if not ground level. Accordingly, the power amplifier 204 may generate very little, if any, RF signals that may interfere with the operation of the LNA 202. Other embodiments of the invention may comprise a power amplifier 204 that may be turned off.

Figure 5:
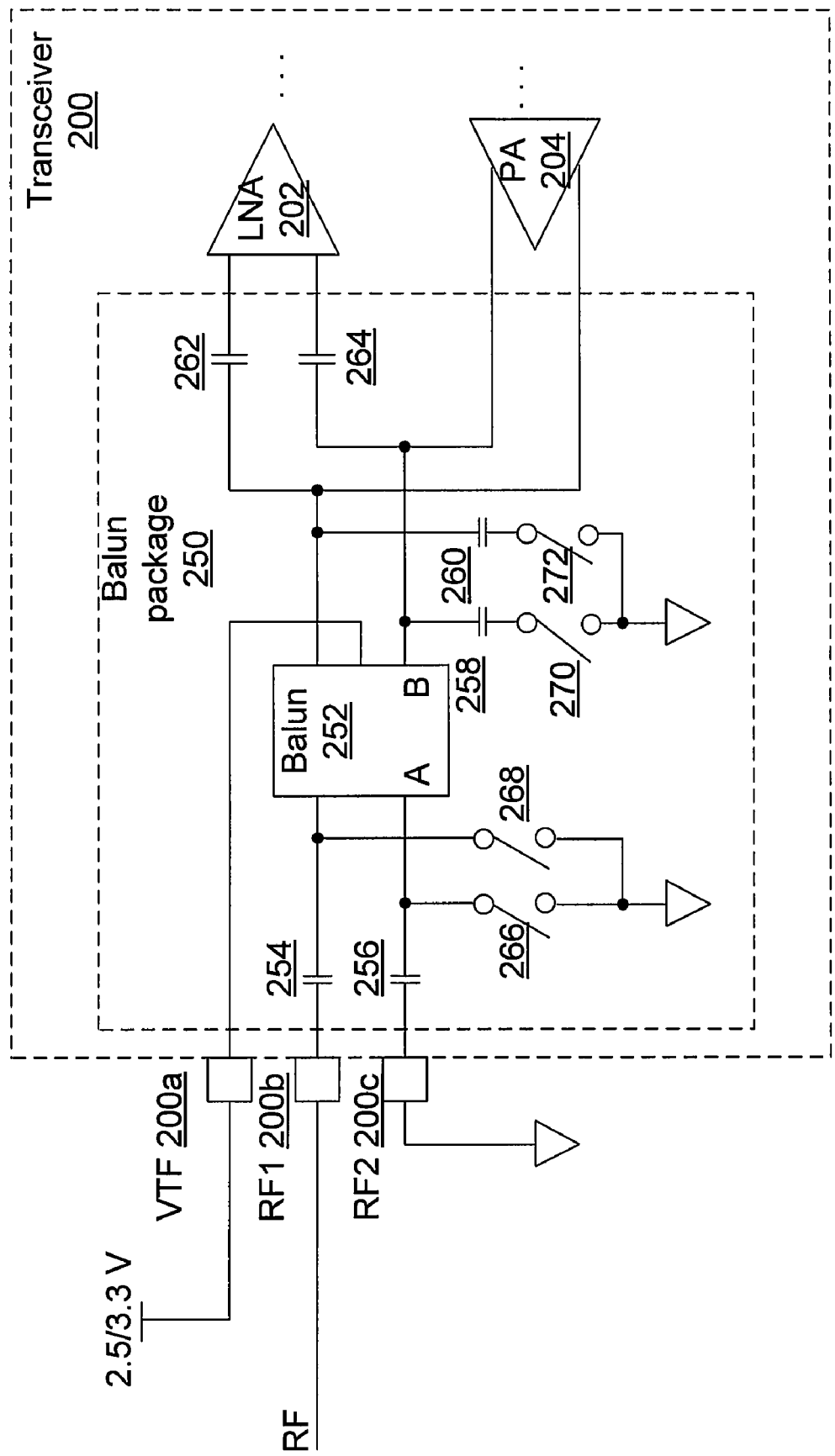
FIG. 5 is a block diagram illustrating an exemplary configuration of a transceiver on a chip, in accordance with an embodiment of the invention.

FIG. 5 is a block diagram illustrating an exemplary configuration of a transceiver on a chip, in accordance with an embodiment of the invention. Referring to FIG. 5, there is shown the transceiver 200 and the balun package 250 in an exemplary configuration for transmit and receive operations that may not use an off-chip power amplifier. There are also shown I/O pads 200a, 200b, and 200c for input and output of signals. The I/O pads may be part of the transceiver 200, or the I/O pads may be part of the balun package 250.

In the transmit mode, the output power of the transceiver 200 may be up to, for example, substantially 12 dBm. Accordingly, the voltage $V_{TF}$ may be, for example, 2.5 volts or 3.3 volts for the higher power output from the power amplifier 204. The LNA 202 may be turned off for single-ended transmit operation. The I/O pad 200b may be used, for example, to communicate RF signals to the antenna 101 for transmission, and the I/O pad 200c may be, for example, coupled to ground.

The switches 266 and 268 may be open. In this manner, the RF signals to be transmitted may be communicated to the inputs of the power amplifier 204 where the RF signals may be amplified. The amplified RF signals may then be communicated to the B side of the balun 252. The RF signals may be coupled to the A side of the balun 252, and thus communicated to the I/O pad 200b. The RF signals may then be communicated to the antenna 101 for transmission. The LNA 202 may be designed to be protected from high output power, for example, of up to substantially 12 dBm at its input nodes.

In the receive mode, the RF signals may be received by the antennal 101 and the received RF signals may be communicated to the A side of the balun 252 via the I/O pad 200b. The RF signals may be coupled to the LNA 202 via the B side of the balun 252. The inputs to the power amplifier 204 may be at a very low power level, if not ground level. Accordingly, the power amplifier 204 may generate very little, if any, RF signals that may interfere with the operation of the LNA 202. Other embodiments of the invention may comprise a power amplifier 204 that may be turned off.

Figure 6:
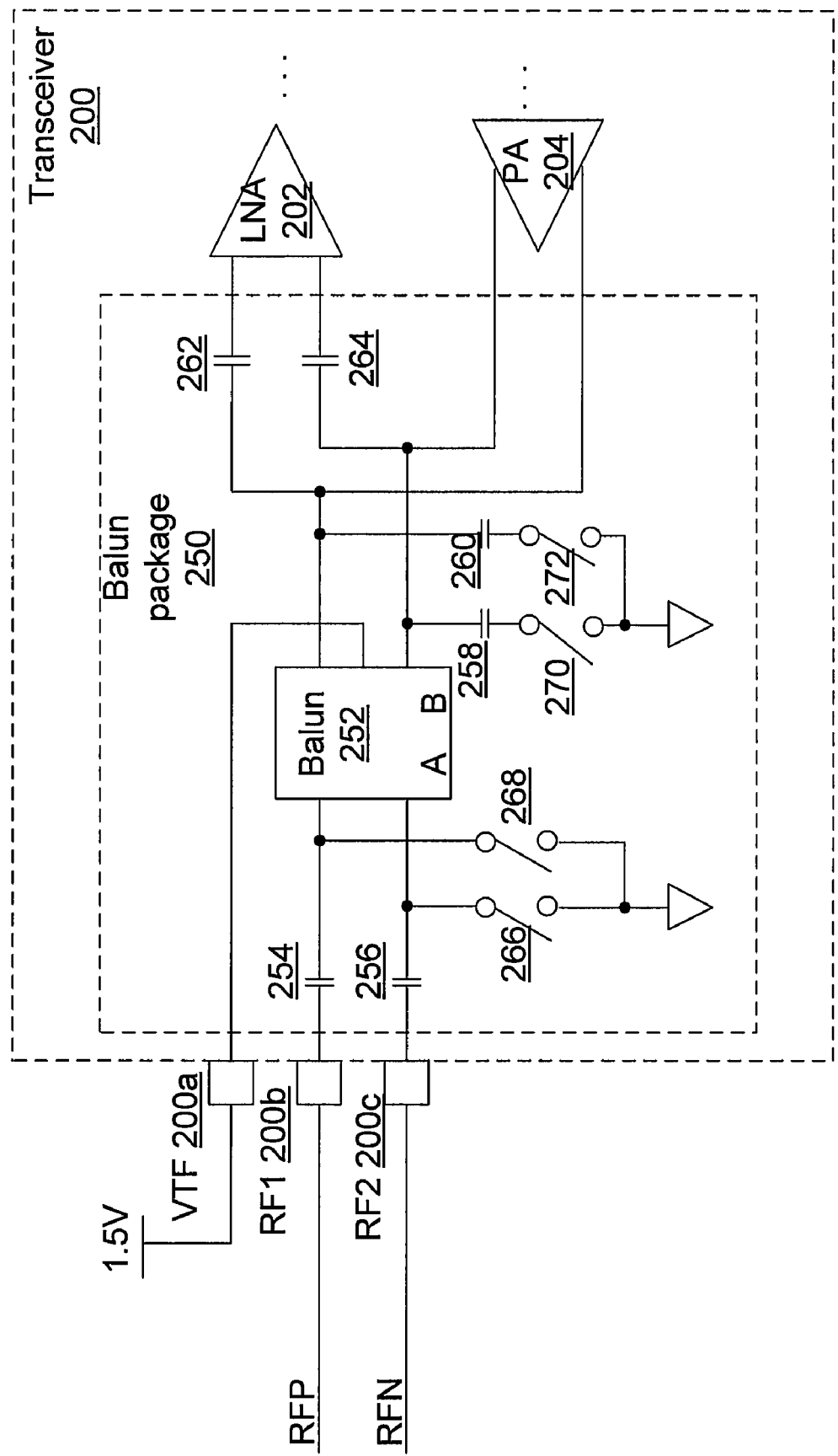
FIG. 6 is a block diagram illustrating an exemplary configuration of a transceiver on a chip, in accordance with an embodiment of the invention.

FIG. 6 is a block diagram illustrating an exemplary configuration of a transceiver on a chip, in accordance with an embodiment of the invention. Referring to FIG. 6, there is shown the transceiver 200 and the balun package 250 in an exemplary configuration for differential transmission and reception. There are also shown I/O pads 200a, 200b, and 200c for input and output of signals. The I/O pads may be part of the transceiver 200, or the I/O pads may be part of the balun package 250.

The voltage $V_{TF}$ may be, for example, 1.5 volts. The switches 266 and 268 may be open. The LNA 202 may be turned off for transmit operations. The I/O pads 200b and 200c may be used to communicate differential RF signals externally to the chip with the transceiver 200. External circuitry (not shown) may be used to process the differential signals from the transceiver 200.

In this manner, the RF signals to be transmitted may be communicated to the inputs of the power amplifier 204 where the RF signals may be amplified. The amplified RF signals may then be communicated to the B side of the balun 252. The RF signals may be coupled to the A side of the balun 252, and thus communicated to the I/O pad 200b. The RF signals may then be communicated to the antenna 101 for transmission. The LNA 202 may be designed to be protected from high output power of up to, for example, substantially 12 dBm at its input nodes.

For receive operations, the LNA 202 may be turned on to amplify received RF signals. The I/O pads 200b and 200c may be used to receive differential RF signals to the transceiver 200. External circuitry (not shown) may be used to generate the differential RF signals from the RF signals received by the antenna 101. The differential RF signals may be communicated to the A side of the balun 252, and the differential RF signals may be coupled to the B side of the balun 252. The differential RF signals may then be communicated to the LNA 202.

Additionally, during the receive mode, the inputs to the power amplifier 204 may be at a very low power level, if not ground. Accordingly, the power amplifier 204 may generate very little, if any, RF signals that may interfere with the operation of the LNA 202. Other embodiments of the invention may comprise a power amplifier 204 that may be turned off.

Figure 7:
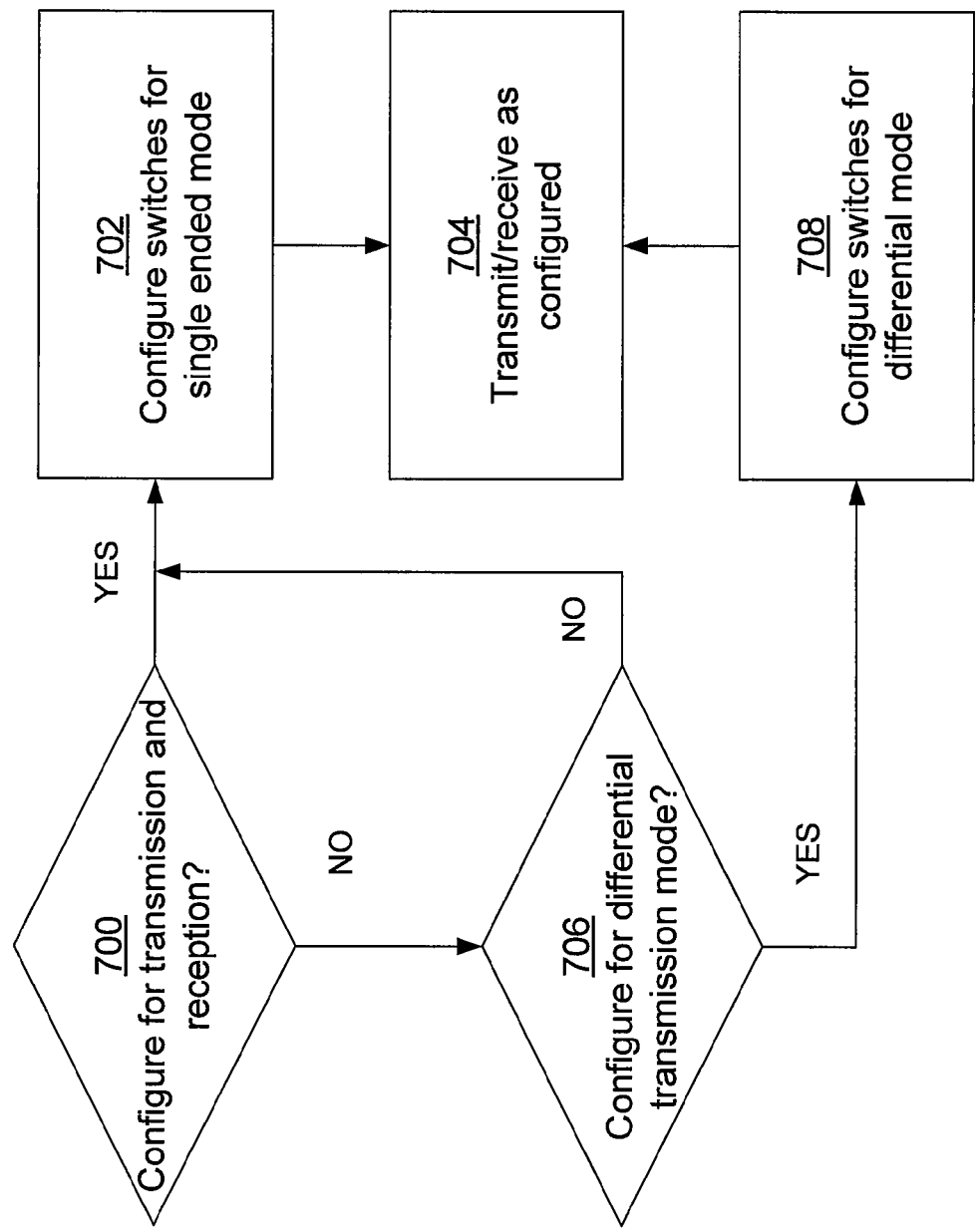
FIG. 7 is a flow diagram illustrating exemplary steps for using a flip chip configurable RF front end with an off-chip balun, in accordance with an embodiment of the invention.

FIG. 7 is a flow diagram illustrating exemplary steps for using a flip chip configurable RF front end with an off-chip balun, in accordance with an embodiment of the invention. Referring to FIG. 7, there is shown steps 700 to 708. In step 700, a determination may be made as to whether the transceiver 200 may operate in receive and/or transmit modes. If the transceiver 200 is to operate for both the receive and transmit modes, the next step may be step 702. If the transceiver 200 is to operate in either the receive mode or the transmit mode, the next step may be step 706.

In step 702, various devices in the balun package 170, such as, for example, the switches 266, 268, 270, and 272, may be configured appropriately for single ended transmit and receive modes. In step 704, the transceiver 200 may be used for operation in transmitting and/or receiving signals.

In step 706, a determination may be made as to whether the transceiver 200 is to operate in a differential mode or a single-ended mode. If the transceiver 200 is to operate in a single-ended mode, the next step may be step 702. If the transceiver 200 is to operate in a differential mode, the next step may be step 708. In step 708, various devices in the balun package 170, such as, for example, the switches 266, 268, 270, and 272, may be configured appropriately for differential operation in either the transmit mode or the receive mode. The next step may be step 704.

In accordance with an embodiment of the invention, aspects of an exemplary system may comprise the balun 172 in the balun package 170, which may be similar to the device package 160. The balun package 170 may comprise one or more layers 160a . . . 160e. The balun package 170 may be bonded to the single transceiver integrated circuit 150, and may be electrically coupled to a single transceiver integrated circuit 150 that may comprise an integrated transmitter and a receiver. The balun package 170 may also comprise discrete devices 174. The discrete devices 174 may comprise, for example, an inductor, a capacitor, a resistor, and/or a switch. The discrete devices 174 may be, for example, the capacitors 254, 256, 258, 260, 262, and/or 264, and/or the switches 266, 268, 270, and/or 272. The balun 172 and/or the discrete devices 174 may be, for example, surface mount devices that may be placed and bonded to the balun package 170. The balun 172 and/or the discrete devices 174 may also be fabricated, for example, as part of the balun package 170 in one or more layers 160a . . . 160e of the balun package 170.

When the balun 172 and/or the discrete devices 174 are fabricated as part of the balun package 170, magnetic material may be deposited in one or more layers 160a . . . 160e of the balun package 170. The magnetic material may, for example, improve quality of the balun 172 and/or the discrete devices 174, and/or enable the balun 172 and/or the discrete devices 174 to be made smaller. The balun package 170 may be configured for reception and/or transmission of RF signals. The balun package 170 and/or the single transceiver integrated circuit 150 may be configured for single-ended RF input, single-ended RF output, differential RF input, and/or differential RF output.

Another embodiment of the invention may provide a machine-readable storage, having stored thereon, a computer program having at least one code section executable by a machine, thereby causing the machine to perform the steps as described above for a flip chip configurable RF front end with an off-chip balun.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will comprise all embodiments falling within the scope of the appended claims.

What is claimed is:

1. A method for processing signals, the method comprising:
    communicating signals to and/or from a single transmitter and/or receiver integrated circuit via a balun in a balun package, wherein:
        said balun package is bonded to said single transmitter and/or receiver integrated circuit;
        said balun package enables said balun to operate in one of a plurality of modes; and
        said balun package comprises one or more switches.
2. The method according to claim 1, wherein said balun package comprises one or more inductors.
3. The method according to claim 1, wherein said balun package comprises one or more capacitors.
4. The method according to claim 1, wherein said balun package is configurable to enable said balun to operate in one of said plurality of modes.
5. The method according to claim 1, wherein said balun package comprises one or more resistors.
6. The method according to claim 1, comprising configuring said balun package for reception of RF signals and/or transmission of RF signals.
7. The method according to claim 1, comprising configuring said balun package and/or said single transmitter and/or receiver integrated circuit for single-ended RF input mode of operation and/or single-ended RF output mode of operation.
8. The method according to claim 7, comprising, in said single-ended RF output mode of operation, electrically coupling an external amplifier to a single transmitter output line to amplify an output signal.
9. The method according to claim 1, comprising configuring said balun package and/or said single transmitter and/or receiver integrated circuit for differential RF input mode of operation and/or differential RF output mode of operation.
10. The method according to claim 1, wherein said balun package comprises a plurality of layers.
11. The method according to claim 10, wherein at least a portion of at least one of said plurality of layers of said balun package has deposition of magnetic material.
12. A system for processing signals, the system comprising:
    a balun in a balun package electrically coupled to a single transmitter and/or receiver integrated circuit, wherein:
        said balun package is bonded to said single transmitter and/or receiver integrated circuit;
        said balun package enables said balun to operate in one of a plurality of modes; and
        said balun package comprises one or more switches.
13. The system according to claim 12, wherein said balun package comprises one or more inductors.
14. The system according to claim 12, wherein said balun package comprises one or more capacitors.
15. The system according to claim 12, wherein said balun package is configurable to enable said balun to operate in one of said plurality of modes.
16. The system according to claim 12, wherein said balun package comprises one or more resistors.
17. The system according to claim 12, wherein said balun package is configured for reception of RF signals and/or transmission of RF signals.
18. The system according to claim 12, wherein said balun package and/or said single transmitter and/or receiver integrated circuit are configured for single-ended RF input mode of operation and/or single-ended RF output mode of operation.
19. The system according to claim 18, comprising, when in said single-ended RF output mode of operation, an external amplifier electrically coupled to a single transmitter output line operable to amplify an output signal.
20. The system according to claim 12, wherein said balun package and/or said single transmitter and/or receiver integrated circuit are configured for differential RF input mode of operation and/or differential RF output mode of operation.
21. The system according to claim 12, wherein said balun package comprises a plurality of layers.
22. The system according to claim 21, wherein at least a portion of at least one of said plurality of layers of said balun package has deposition of magnetic material.
23. A method for processing signals, the method comprising:
    communicating signals to and/or from a single transmitter and/or receiver integrated circuit via a balun in a balun package, wherein:
        said balun package is bonded to said single transmitter and/or receiver integrated circuit;
        said balun package enables said balun to operate in one of a plurality of modes, wherein said plurality of modes comprise a mode in which both sides of said balun are differentially configured; and
        said balun package comprises one or more switches.
24. A system for processing signals, the system comprising:
    a balun in a balun package electrically coupled to a single transmitter and/or receiver integrated circuit, wherein:
        said balun package is bonded to said single transmitter and/or receiver integrated circuit;
        said balun package enables said balun to operate in one of a plurality of modes, wherein said plurality of modes comprise a mode in which both sides of said balun are differentially configured; and
        said balun package comprises one or more switches.

* * * * *